United States Patent
Elliott

(10) Patent No.: US 6,593,869 B1
(45) Date of Patent: Jul. 15, 2003

(54) HIGH EFFICIENCY, HIGH OUTPUT DRIVE CURRENT SWITCH WITH APPLICATION TO DIGITAL TO ANALOG CONVERSION

(75) Inventor: Kenneth Robert Elliott, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/112,794

(22) Filed: Mar. 28, 2002

(51) Int. Cl.[7] .............................................. H03M 1/66
(52) U.S. Cl. ...................................... 341/154; 341/144
(58) Field of Search ............................... 341/154, 144, 341/136

(56) References Cited

U.S. PATENT DOCUMENTS

| | | | |
|---|---|---|---|
| 5,917,360 A | 6/1999 | Yasutake | 327/387 |
| 6,100,738 A | 8/2000 | Illegems | 327/165 |
| 6,211,583 B1 | 4/2001 | Humphreys | 307/131 |
| 6,266,001 B1 * | 7/2001 | Fang | 341/144 |
| 6,295,012 B1 | 9/2001 | Greig | 341/136 |
| 6,317,069 B1 | 11/2001 | Male et al. | 341/154 |
| 6,380,877 B2 * | 4/2002 | Castaneda | 341/154 |

OTHER PUBLICATIONS

Fields, C.H., et al., "Progress toward 100 GHz Logic in InP HBT IC Technology," *International Journal of High Speed Electronics and Systems*, vol. 11, No. 1, pp. 217–243 (2001).

Micovic, M., et al., "GaN/AlGaN high electron mobility transistors with $f_T$ of 110GHz," *Electronics Letters*, vol. 36, No. 4, pp. 358–359 (Feb. 17, 2000).

Tietze, U. and Ch. Schenk, "D/A Converters in Bipolar Technology," *Electrical Circuits: Designs and Applications*, pp. 681–682 (1991).

* cited by examiner

Primary Examiner—Brian Young
(74) Attorney, Agent, or Firm—Ladas & Parry

(57) ABSTRACT

A high unity current gain frequency composite switching device, having high voltage compliance and capable of handling high power signals. A current switch comprising of the composite switching devices including a switch stage implemented in a InP-HBT technology and a cascode stage implemented in a GaN FET technology. A digital-to-analog converter comprising a plurality of the current switches, wherein selected output of the switches are electrically coupled to form an output of the digital-to-analog converter.

30 Claims, 9 Drawing Sheets

HIGH EFFICIENCY, HIGH OUTPUT DRIVE CURRENT SWITCH WITH APPLICATION TO DIGITAL TO ANALOG CONVERSION

TECHNICAL FIELD

The present application relates to a four terminal composite switching device and in particular to a high unity current gain frequency four terminal composite switching device with a high voltage compliance. The present invention also relates to the field of current switches using four terminal composite switching devices. The present invention also relates to the field of digital to analog converters using current switches and in particular to high efficiency, high power digital to analog converters.

BACKGROUND

The ability of prior art devices to perform high power amplification and signal generation at microwave and millimeter wave frequencies is limited by the breakdown voltage and/or high unity current gain frequency, $f_t$, of the device. For such devices, high breakdown voltage and high $f_t$ characteristics are generally mutually exclusive since high breakdown voltage semiconductor materials have larger bandgaps and hence lower electron mobility, and conversely, high frequency performance semiconductors have higher electron mobility but lower breakdown voltages.

Traditionally, microwave and millimeter wave power amplification has been dominated by mostly analog class AB implementations. Other configurations such as class E, F, and S implementations have been used to improve the efficiency or linearity of generated signals, but simultaneous performance improvement in linearity, power output and maximum frequency has been difficult to achieve.

In microwave and millimeter wave applications, a high speed and high power Digital to Analog Converter (DAC) could be used to replace power amplifiers allowing for improved system linearity. In addition, high unity current gain frequency, high power DACs could be used to generate microwave signals straight from digital signals without the need for analog up-converters. The ability to translate digital signals to analog signals without analog up-converters improves the system performance by eliminating the degradation caused by out-of-band spurs generated by analog up-conversion. The functional operation of a DAC is well known. Generally, a DAC accepts a digital input signal and converts it into an analog output signal. The digital input signal has a range of digital codes which are converted into a continuous range of analog signal levels of the analog output signal.

Referring now to FIG. 1, a functional block diagram is shown of a conventional DAC 100 that is capable of high speed switching. This DAC 100 is a differential binary weighted converter comprising two inverted R–2R resistance ladder circuits 101, 102 having resistors whose resistance values are R and 2R and a plurality of differential current-switch circuits 120, structured identically to one another. The number of current switches is equal to the number of input bits of the DAC 100. The current switch circuits 120 are electrically connected between the R–2R ladder networks and a negative potential voltage $V_{ee}$, i.e. –5 volts. The true outputs of each of the current switches are electrically connected to one of the two inverted R–2R resistance ladders. The false outputs of each of the current switches are electrically connected to the other of the two inverted R–2R resistance ladders. An external reference is applied to $V_{DAC}$, and the R–2R ladder divides the input current into binary weighted currents. The digital input is used to control the position of the switches.

Further, in the prior art, digital to analog design utilizing the highest speed, high unity current gain frequency, integrated circuit technology for clock rates greater than 1 GHz results in technologies that have lower breakdown voltages than the higher voltage technology used for power applications, such as microwave and millimeter applications. The present invention enables a fully digital architecture through a power amplifier with speeds commensurate with lower breakdown voltage technologies and output powers commensurate with higher breakdown voltage, lower frequency technologies.

One object of the present invention is to provide a switching architecture that can support both high unity current gain frequency, $f_t$, and high voltages and that effectively provides the ability to simultaneously achieve linearity, high power output and maximum frequency.

According to one embodiment of the present invention, the current switch comprises a first stage fabricated in a high $f_t$, low band gap semiconductor such as an InP HBT (Heterojunction Bipolar Transistor). The critical property of this technology is that it provides the highest possible current switching speed. The current output drives a second stage comprising of a cascoded three terminal device fabricated in a high breakdown voltage semiconductor such as a GaN Field-Effect Transistor (FET) or HBT. By operating the second stage as a cascode, the device can switch at much higher speed than would normally be obtained with such device.

SUMMARY

It is an object of this invention to provide a high unity current gain frequency composite device with high voltage compliance. A device in accordance with the present invention comprises a switch stage implemented in a high unity current gain frequency, $f_t$, technology with low breakdown voltage, combined with a second stage having a high maximum oscillation frequency, $f_{max}$, and a high breakdown voltage. High $f_t$ technology preferably refers to $f_t$ greater than or equal to 150 GHz for HBT technologies and $f_t$ greater than or equal to 100 GHz for FET technologies. High breakdown voltages are preferably greater than low breakdown voltages, and low breakdown voltages are preferably less than or equal to 5V.

In another embodiment, the device is preferably electrically coupled to a current source. The result is a high unity current gain frequency current switch with high voltage compliance.

In a preferred embodiment the first stage utilizes InP-HBT technology to achieve high unity current gain frequency, in a hybrid, possibly flip-chip assembly, while the second cascode switch stage utilizes GaN FET technology for high voltage.

In one embodiment, the present invention relates to digital to analog converters comprising a plurality of high $f_t$, high voltage compliance current switches. The digital to analog converters are especially suited for microwave and millimeter wave applications.

In one embodiment, the present invention relates to a device comprising: a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz; and a second stage comprising at least one second stage semiconductor device, said at least one second stage semiconductor device having a second stage semiconductor breakdown voltage greater than the first stage semiconductor device breakdown voltage, and said second stage being electrically coupled to said first stage.

In one embodiment, the present invention relates to a dual-ended current switch comprising: a current source; a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz, and said first stage being electrically coupled to said current source; and a second stage comprising at least one second stage semiconductor device, said at least one second stage semiconductor device having a second stage semiconductor breakdown voltage greater than the first stage semiconductor device breakdown voltage, and said second stage being electrically coupled to said first stage such that said first stage is in between said current source and said second stage.

In another embodiment, the present invention relates to a single-ended current switch comprising: a current source; a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz, and said first stage being electrically coupled to said current source; and a second stage comprising at least one second stage semiconductor device, said at least one second stage semiconductor device having a second stage semiconductor breakdown voltage greater than the first stage semiconductor device breakdown voltage, and said second stage being electrically coupled to said first stage such that said first stage is in between said current source and said second stage It is another object of this invention to provide a digital-to-analog converter comprising: a plurality of current switches; and a plurality of R–2R ladder networks electrically coupled to said plurality of current switches; wherein each of said plurality of current switches comprises: a current source; a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz, and said first stage being electrically coupled to said current source; and a second stage comprising at least one second stage semiconductor device, said at least one second stage semiconductor device having a second stage semiconductor breakdown voltage greater than the first stage semiconductor device breakdown voltage, and said second stage being electrically coupled to said first stage such that said first stage is in between said current source and said second stage.

DETAILED DESCRIPTION

Figure 2:
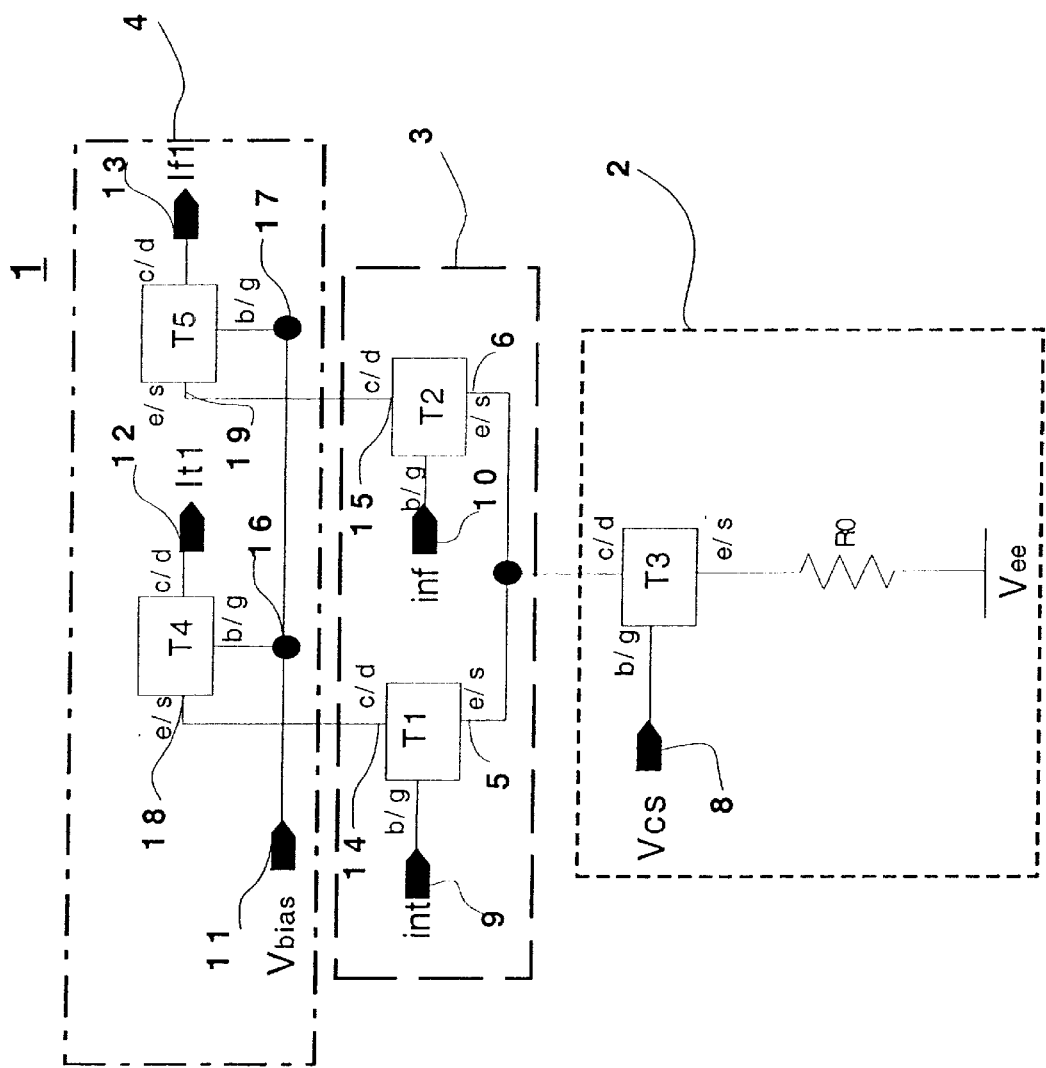
FIG. 2 is a schematic diagram illustrating one embodiment of a current switch in accordance with the present invention.

Turning to FIG. 2, one embodiment of a current switch 1 in accordance with the present invention is shown. The square boxes T1, T2, T3, T4 and T5 are generic representations of semiconductor devices which may be of any type, herein referred to as transistors. There are three terminals on a transistor, each have different names depending on the type of transistor. Thus, the nature of each terminal is indicated next to the terminal. The first terminal of the device is labeled "c/d" for collector/drain, the second terminal is labeled by "b/g" for base/gate, and the third terminal is labeled "e/s" for emitter/source to reflect the fact that either bipolar transistor and/or field effect transistor technology can be utilized.

The differential current switch 1 preferably comprises a current source 2, a first stage 3 and a second stage 4, as illustrated in FIG. 2. The current source 2 is electrically coupled to the first stage 3. The current source 2 shown may be provided by a single transistor T3 with a resistor R0; however, one skilled in the art will appreciate that the current source may be formed by any current source circuit which produces a predetermined constant current. Voltage $V_{CS}$ at terminal 8 is a node voltage which, together with transistor T3 and resistor R0, controls the current through the current source.

The first stage 3 provides for current switching in this system. The first stage 3 comprises at least one semiconductor device preferably fabricated from a high $f_t$, low breakdown voltage technology. The second stage 4 provides the switch with the ability to provide the high voltages required for millimeter and microwave technologies. The second stage 4 is comprised of at least one semiconductor device preferably fabricated from a breakdown voltage technology which is higher than the breakdown voltage technology used in the first stage.

In one embodiment, as shown in FIG. 2, the first stage 3 comprises two three terminal semiconductor devices, transistors T1 and T2. The third terminal 5 of T1 is preferably electrically coupled with the third terminal 6 of T2, resulting in the transistors being electrically connected as a differential pair. The third terminals 5, 6 of T1 and T2 are also electrically coupled to the current source 2. The current source controls the current through the first stage. Connectors 9 and 10 are complementary input node voltages which drive the switch. Voltage applied to connector 9 switches ON and OFF transistor T1, while voltage applied to connector 10 switches ON and OFF transistor T2.

As shown in FIG. 2, the second stage 4 is electrically coupled to the first stage 3 such that the first stage 3 is between the current source 2 and the second stage 4. The second stage 4 preferably includes two three terminal semiconductor devices, transistors T4 and T5. The second terminal 16 of T4 is preferably electrically coupled to the second terminal 17 of T5, resulting in the transistors being electrically connected as a cascode. By operating transistors T4 and T5 as a cascode, the second stage can switch at a much higher speed than would normally be obtained with other configurations. The output current of transistor T1 drives the third terminal 18 of transistor T4, while the output current of transistor T2 drives the third terminal 19 of transistor T5. The second terminals 16, 17 of transistors T4 and T5 are controlled by voltage $V_{bias}$ at terminal node 11. $V_{bias}$ at terminal node 11 is preferably chosen such that the voltage on transistors T1 and T2 does not exceed the breakdown voltages of these transistors. For example, $V_{bias}$ at terminal node 11 is preferably set to −3 Volts. The outputs 12, 13 of T4 and T5 provide a differential output of the current switch.

Transistors T1, T2 and T3 are preferably fabricated in a high $f_t$, low breakdown voltage technology. InP single HBTs (Heterojunction Bipolar Transistors) with InP substrates, InGaAs collectors and breakdown voltages of roughly 3V are particularly adequate. Other possible high $f_t$, low voltage technologies for transistors T1, T2 and T3 include, but are not limited to, InP Single HBTs, thin collector InP Double HBTs, InP High Electron Mobility Transistors (HEMTs), InP Field-Effect Transistors (FETs), GaAs Metal-Semiconductor Field-Effect Transistors (MESFETs), Si Metal Oxide Semiconductor Field-Effect Transistors (MOSFETs) (designed for high unity current gain frequencies, low breakdown voltages), and thin collector SiGe HBTs. Thin collector technology is characterized by collectors with a thickness of less than 4000 angstroms. Those skilled in the art will recognize that there are several well known processes available to manufacture the variety of semiconductor devices that may be used in the first stage 3 of the present invention. One article of reference for the manufacture of the first stage 3 is C. H. Fields, M. Sokolich, S. Thomas, K. Elliott and J. Jensen, "Progress toward 100 GHz Logic in InP HBT IC Technology", 2001, International Journal of High Speed Electronics and Systems, Vol. 11, No. 1 pages 217–243.

Transistors T4 and T5 are preferably Field-Effect Transistors (FETs) fabricated from a high breakdown voltage material such as GaN. Other possible high breakdown voltage technologies for transistors T4 and T5 include, but are not limited to, GaN FETs, GaN HBTs, thick collector InP DHBTs, Silicon Carbide based (SiC-based) transistors, and GaAs HBTs. Thick collector technology is characterized by collectors with a thickness greater than 4000 angstroms. Those skilled in the art will recognize that there are several well known processes available to manufacture the variety of semiconductor devices that may be used in the second stage 4 of the present invention. One article of reference for the manufacture of the second stage 4 is M. Micovic, N. X. Nguyen, P. Janke, W.-S. Wong, P. Hashimoto, L.-M. McCray, C. Nguyen, "GaN/AlGaN high electron mobility transistors with $f_t$ of 110 GHz", Feb. 17, 2000, Electronic Letters, vol. 36, no. 4, pages: 358–359.

The output compliance, or the maximum voltage output of the transistor during nominal operation, is limited by the safe breakdown operating margin of the transistor. As shown in FIG. 2, transistors T4 and T5 are preferably configured in a common gate/base cascode, and consequently the maximum operating frequency is determined by the common gate/base cutoff frequency which is typically much higher than the common source/emitter operating frequency.

The resulting current switch can be used to obtain higher output voltage compliance at higher switching frequency than could be obtained otherwise.

Figure 3:
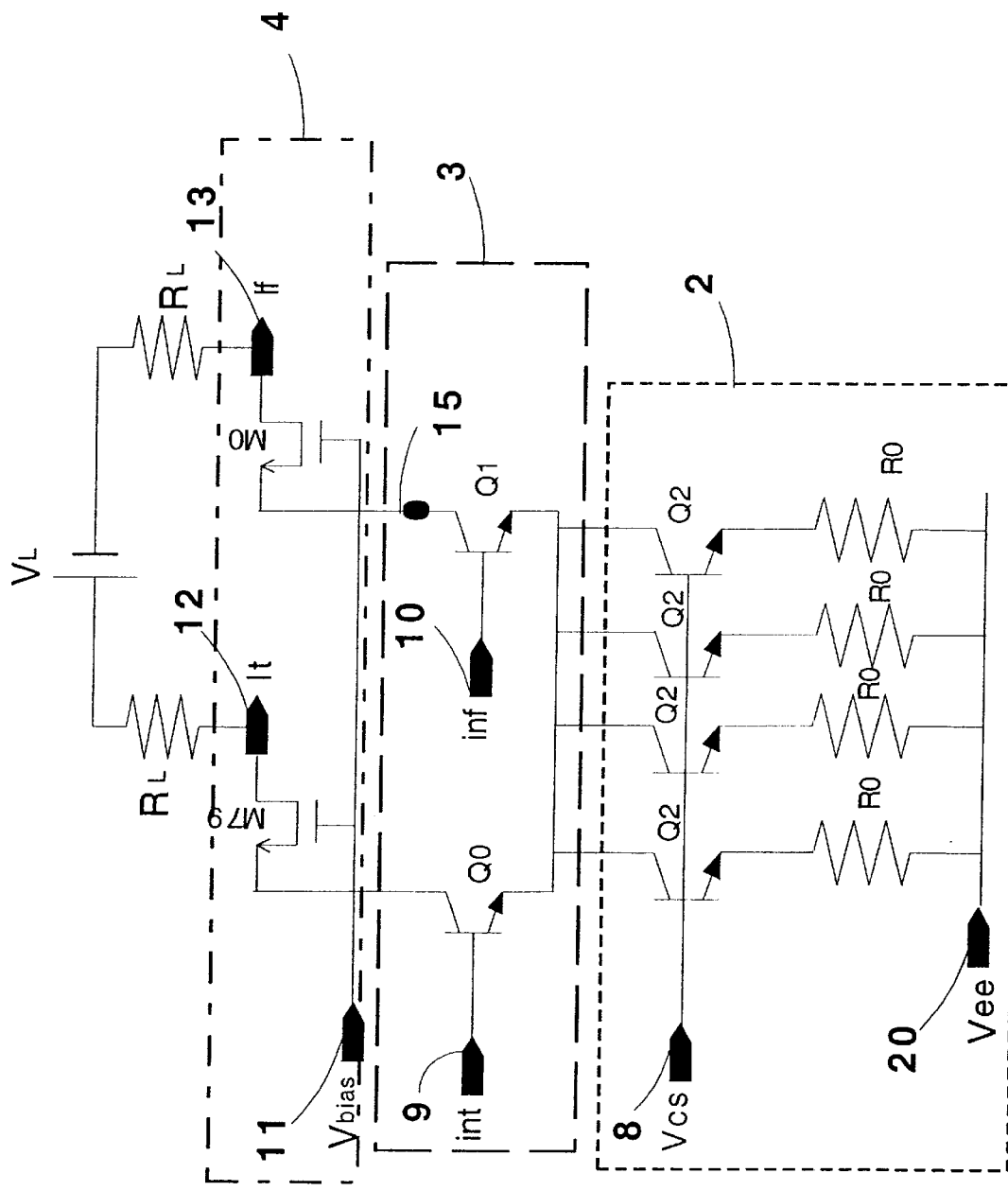
FIG. 3 is a schematic diagram illustrating another embodiment of a current switch in accordance with the present invention.

A preferred embodiment of a current switch in accordance with the present invention is shown in FIG. 3. Current source 2 is represented by four legs, each comprising a transistor Q2 and a resistor R0 such that the current is equally divided between the four legs of the current source 2. One skilled in the art will appreciate that current source 2 may take on many forms well known in the art.

Figure 4:
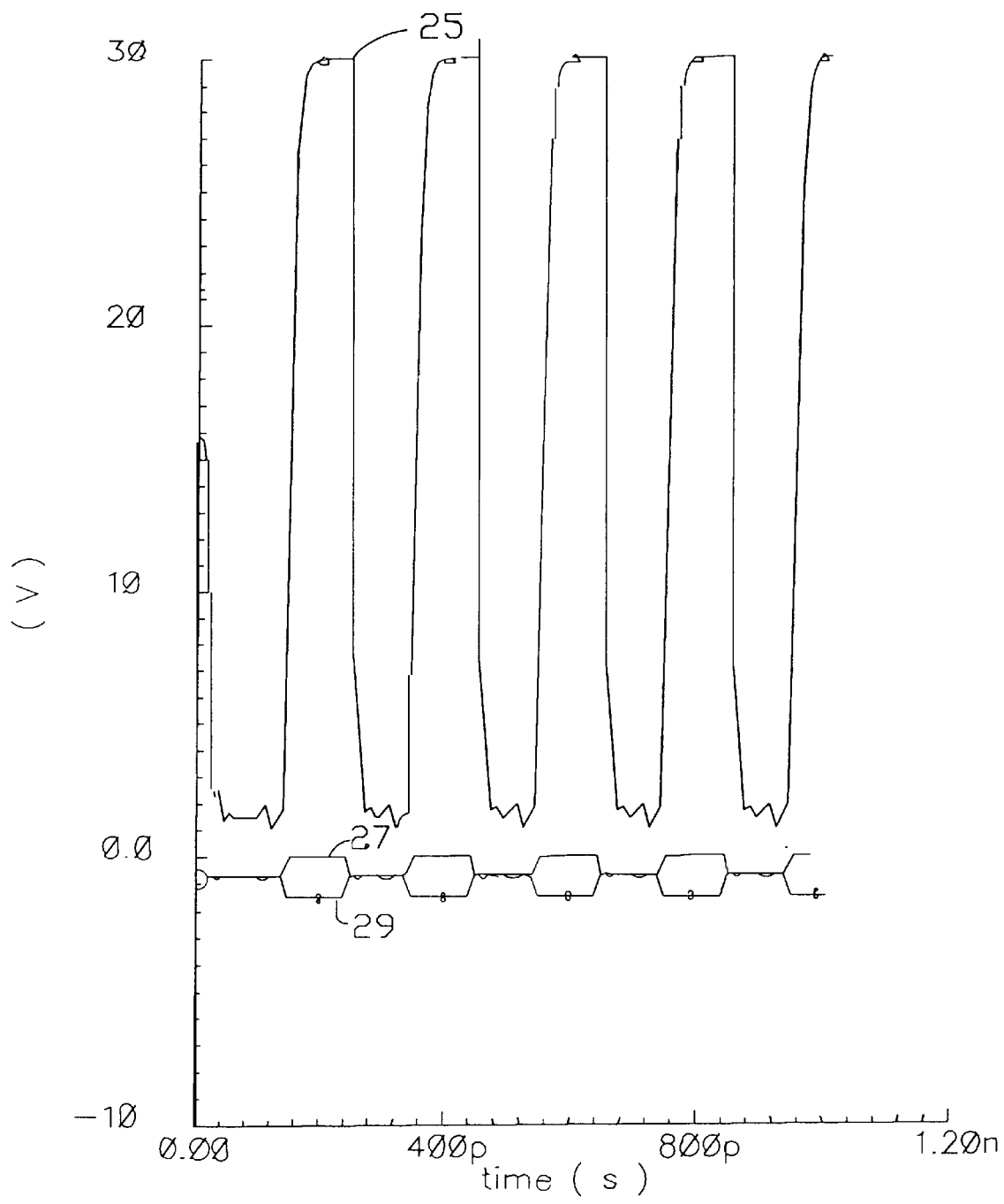
FIG. 4 is a graph of a simulation illustrating operation of the embodiment FIG. 3.

Turning to FIG. 4, the results of a computer simulation of the current switch of FIG. 3 is shown. In this simulation transistors M79 and M0 were modeled as 1 millimeter wide GaN FETs with a 0.1 micrometer gate length. Transistors Q0, Q1, and Q2 were modeled as InP HBTs with 1 micrometer wide by 5 micrometers long emitters. The GaN FETs modeled in the simulation had their threshold voltage parameter set to −3 Volts. For simulation purposes, resistors $R_L$ were electrically coupled to output nodes 12 and 13 at one end and a voltage supply $V_L$ at the other to provide a load for the differential current switch. In the simulation, $R_L$ was chosen to be 1350Ω and $V_L$ was chosen to be 30 Volts. The input voltages applied to nodes 9 and 10 varied between −0.8 Volts and −1.5 Volts. A voltage of −3 Volts was applied to nodes 11 and 20. A voltage of −1.8 Volts was applied to node 8. The top trace 25 of FIG. 4 represents the output voltage at terminal 13 of FET M0 when driving a load resistance electrically connected to terminal 13. The next trace 27 shows the collector voltage 15 of HBT Q1. The final trace 29 shows the base voltage 10 of HBT Q1. FIG. 4 shows how the voltage across high unity current gain frequency HBT Q1 is reduced to safe levels, less than the breakdown voltage of Q1, and the maximum frequency of FET M0 is realized. In view of the symmetry of the circuit, the same observations would apply to FET M79 and HBT Q0.

Figure 5:
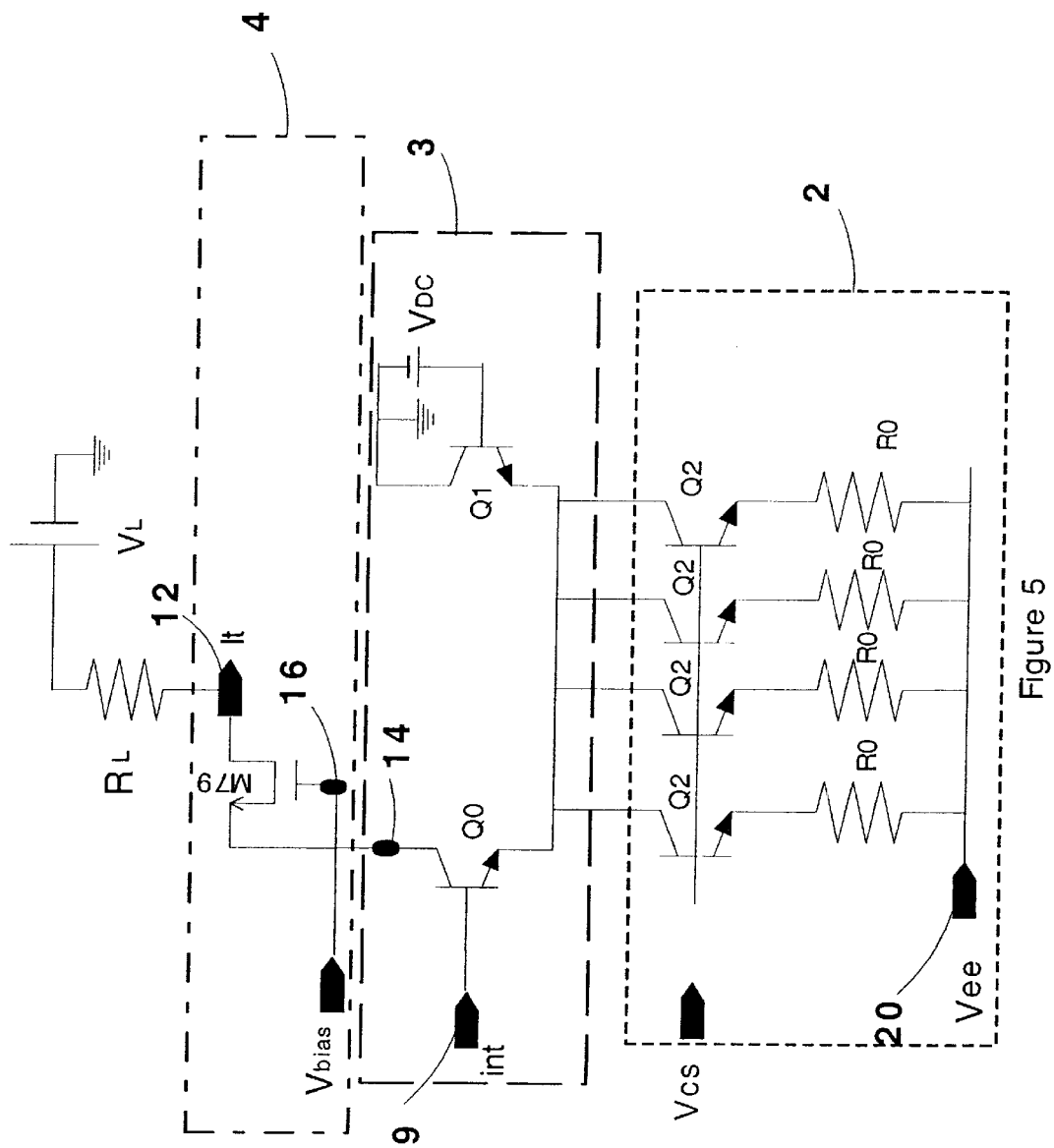
FIG. 5 is a schematic diagram of an embodiment of a single-ended current switch in accordance with the present invention.
Figure 6:
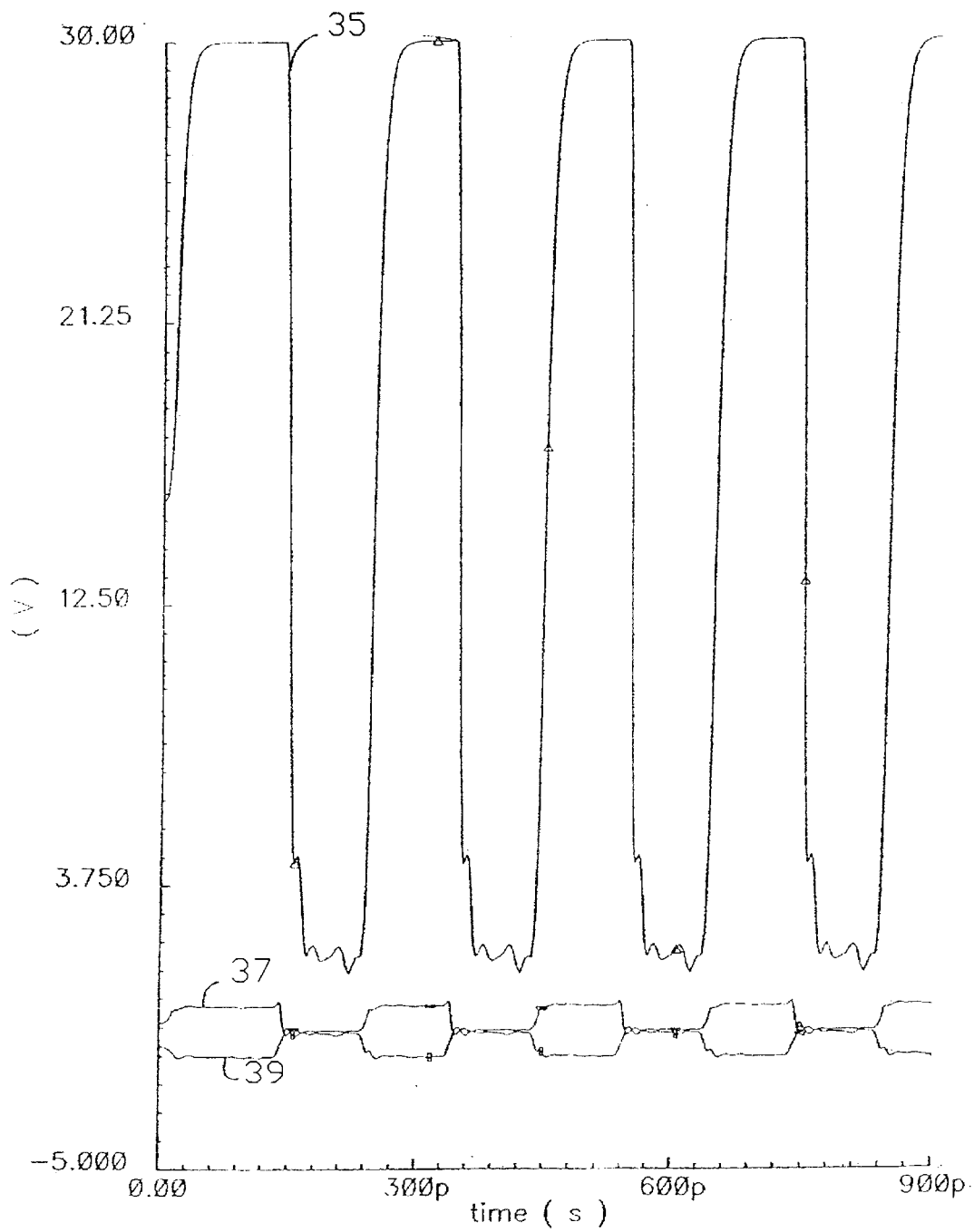
FIG. 6 is a graph of a simulation illustrating operation of the embodiment of FIG. 5.

In FIG. 5 a single ended current switch in accordance with the present invention. In FIG. 5, transistor Q1 is used to provide a bias reference to Q0. The value of the bias, $V_{DC}$, is chosen to be in between the maximum and minimum input levels into node 9. In a computer simulation of the single ended current switch of FIG. 5, the results of which are shown in FIG. 6, the reference level $V_{DC}$ is chosen to be −1.2 Volts. In the case of a single ended current switch, only one transistor M79 is necessary in the second stage 4. The transistors are modeled in the computer simulation with the same parameters as were set in the model of the differential current switch as discussed above. The voltage levels at node 9 range between −0.8 Volts and −1.5 Volts. A 1350Ω resistor $R_L$ is electrically connected between node 12 and a 30 Volt voltage source $V_L$ in order to provide a load to the single ended current switch in the simulation. The voltage $V_{bias}$ provided at node 16 is −3 Volts. The current source 2 is the same as the current source used in the simulation of the differential current switch discussed above. The GaN FET M79 modeled in the simulation had its threshold voltage parameter set to −3 Volts.

FIG. 6 shows the results of the computer simulation using the embodiment of FIG. 5 with the values as discussed above. The top trace 35 represents the output voltage at terminal 12 of FET M79 when driving a load resistance electrically connected to terminal 12. The next trace 37 shows the collector voltage 14 of HBT Q0. The final trace 39 shows the base voltage 9 of HBT Q0. FIG. 6 shows how the voltage across high unity current gain frequency HBT Q0 is reduced to safe levels, less than the breakdown voltage of Q0, and the maximum frequency of FET M79 is realized.

Figure 1:
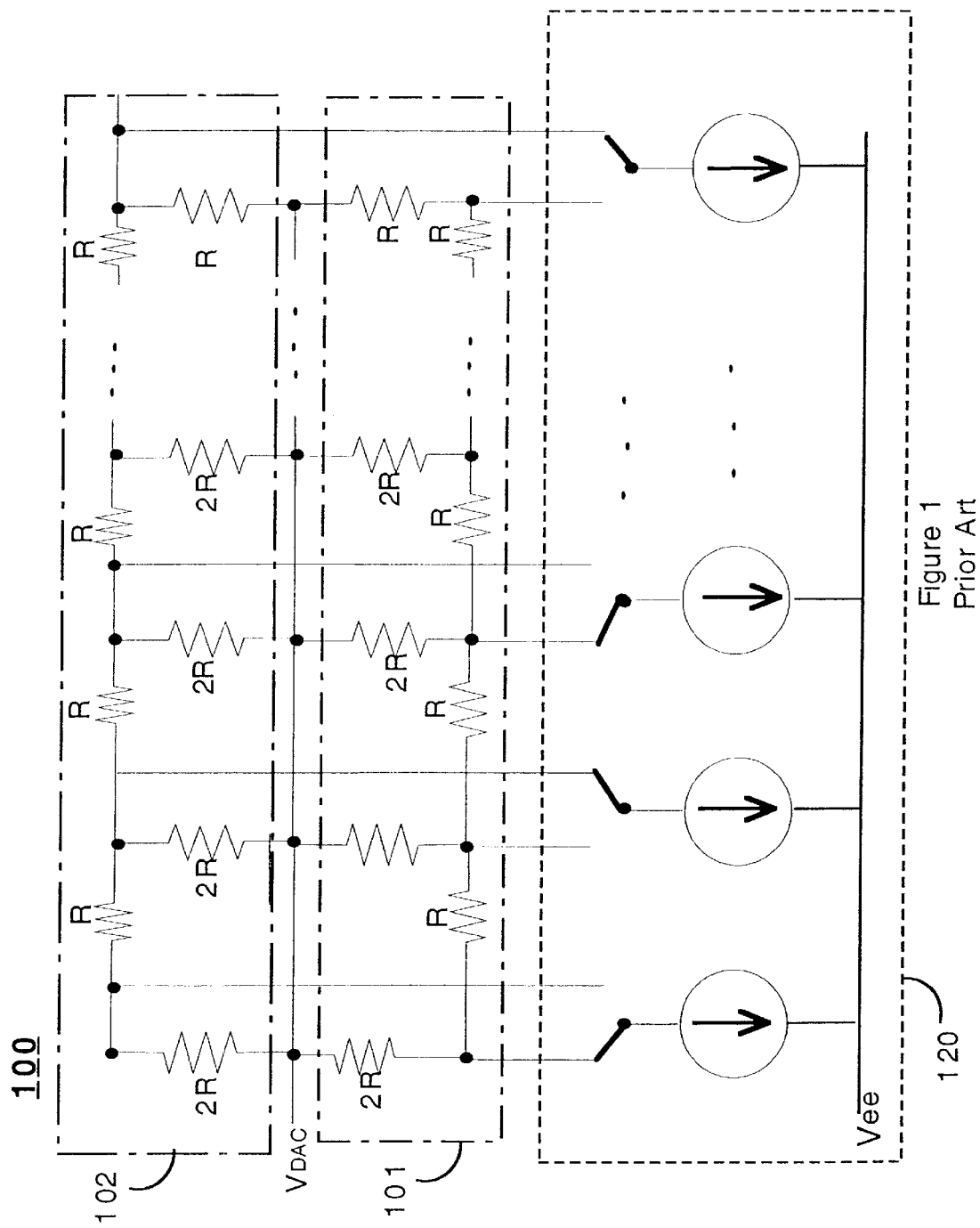
FIG. 1 is a block diagram of a prior art digital to analog converter
Figure 7:
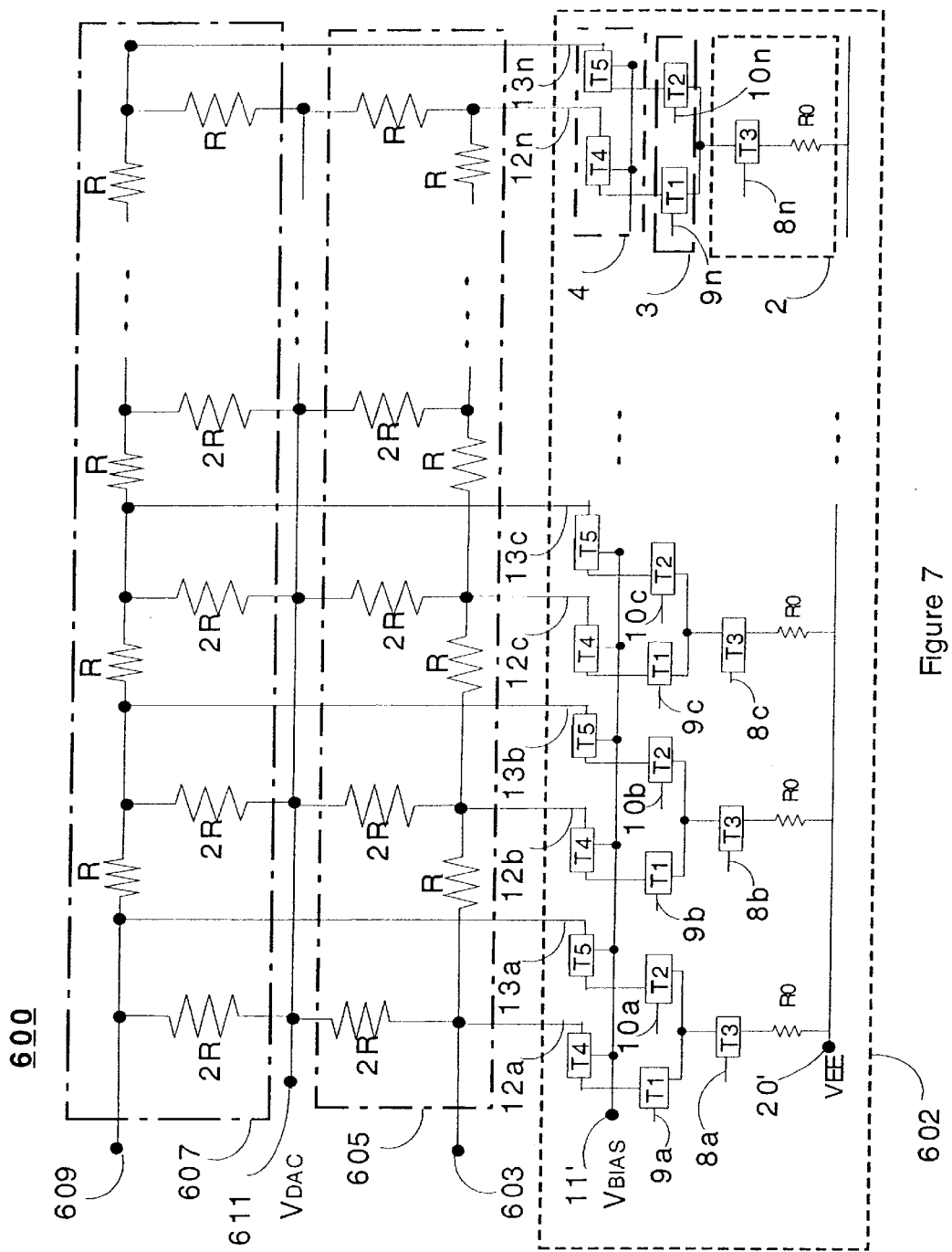
FIG. 7 is a schematic diagram of a digital to analog converter in accordance with the present invention.

Turning to FIG. 7, a digital-to-analog converter (DAC) 600 with two R–2R ladder networks 605, 607 in accordance with the present invention is shown. The DAC 600 comprises a plurality of differential current switches 602 in accordance with the present invention and two R–2R resistive ladder networks 605, 607 to generate the analog voltage signal responsive to a digital input signal. Each differential current switch comprises a current source 2, a first stage 3 and a second stage 4 as previously described in reference to FIGS. 2 and 3. The operation of the DAC 600 is principally the same as the operation of DAC 100 of FIG. 1. The added benefit of DAC 600 is that the voltage supplied to $V_{DAC}$ is no longer required to be a low voltage of approximately −1 Volt, but rather can be higher voltages greater than 5V. Typical voltages applied to $V_{DAC}$ are preferably 20 to 40 volts or higher. Each output 12a–12n from each current switch is electrically connected to one R–2R ladder network 605, while each output 13a–13n from each current switch is electrically connected to the other R–2R ladder network 607. The sum of the currents at each node drive the R–2R resistive ladder network.

Figure 8:
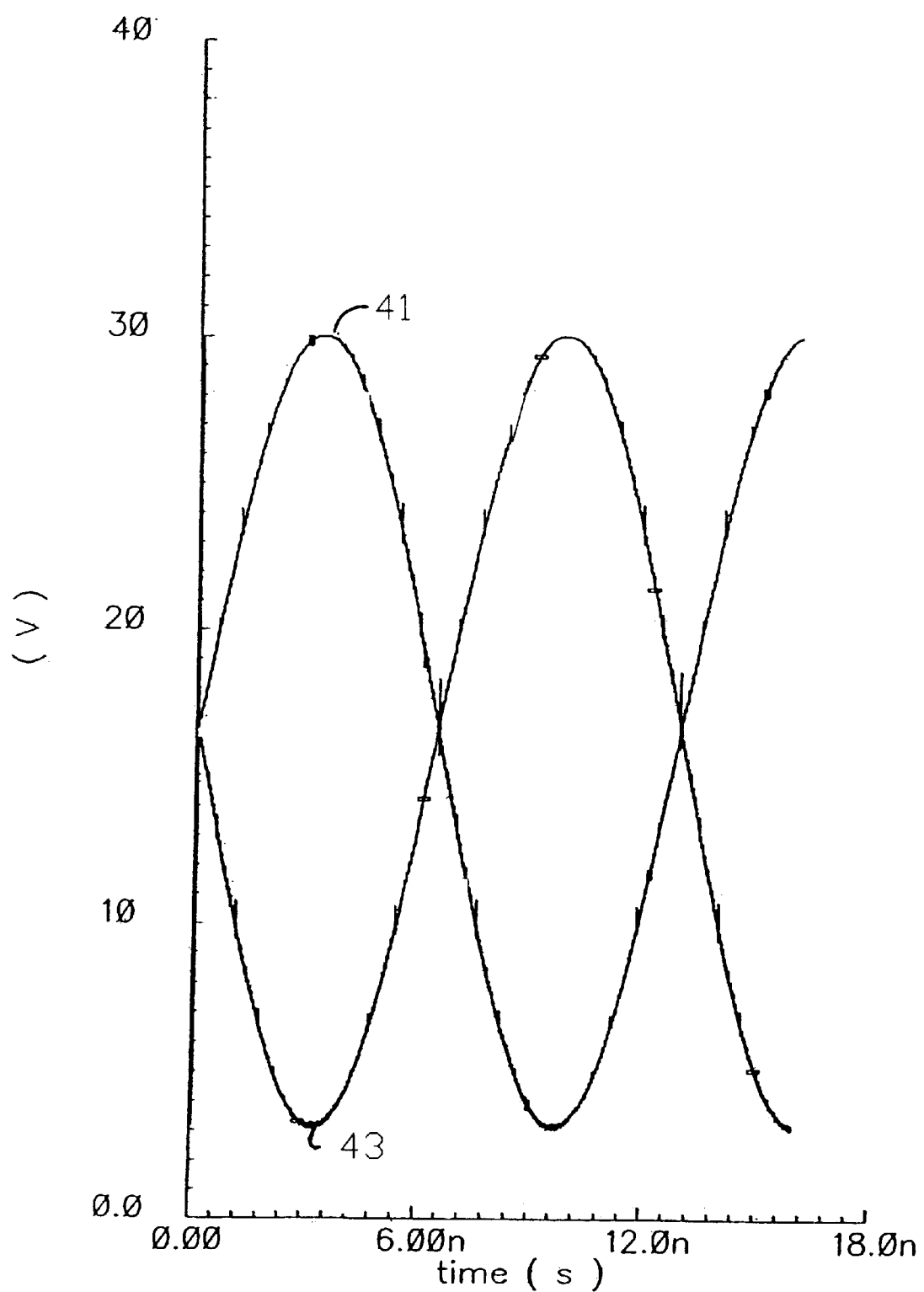
FIG. 8 is a graph of a simulation illustrating operation of the embodiment of FIG. 7.

FIG. 8 shows the computer simulation results of the DAC shown in FIG. 7. In the computer simulation the value R in the R–2R ladder networks was chosen to be 500Ω. The differential current switches were modeled very much like the differential current switches in FIG. 3. Transistors T4 and T5 were modeled as 1 millimeter wide GaN FETs with a 0.1 micrometer gate length. Transistors T1, T2, and T3 were modeled as InP HBTs with 1 micrometer wide by 5 micrometers long emitters. The GaN FETs T4, T5 modeled in the simulation had their threshold voltage parameter set to −3 Volts. The input voltages applied to nodes 9a–9n and 10a–10n varied between −0.8 Volts and 1.5 Volts. A voltage of −3 Volts was applied to nodes 11' and 20'. A voltage of −1.8 Volts was applied to nodes 8a–8n. A voltage of 30 Volts was applied at $V_{DAC}$, terminal node 611. The current through each of the current sources 2 is 26 mA. The curve 41, in FIG. 8, depicts the voltage at the output 603 of the DAC 600. The curve 43 depicts the voltage at the output 609 of the DAC 600. As is evident from FIG. 8, the two outputs 603, 609 of the DAC 600 are a complement of each other.

The desired output voltage swing can be adjusted by adjusting the currents though the current sources 2. The maximum output voltage swing that can be obtained depends on the voltage swing of the voltage applied to $V_{DAC}$ terminal node 611. In the case of the present example the maximum output voltage swing is approximately 27 Volts.

One skilled in the art will appreciate that there are a variety of different DACs that use current switches in which the current switch of the present invention may be used. For example, the current switch as shown in FIG. 5 could be used with a single R–2R ladder network in a digital to analog converter.

Figure 9A:
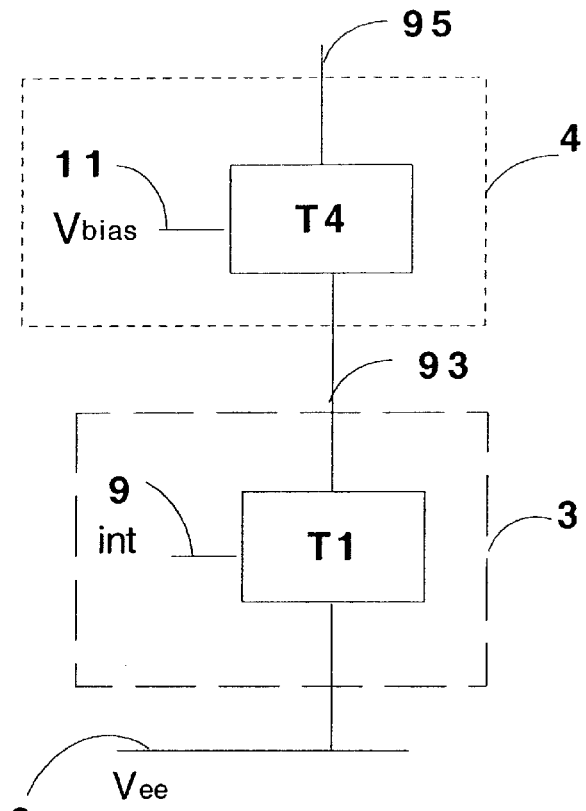
FIG. 9a is a schematic diagram illustrating another embodiment of the present invention.
Figure 9B:
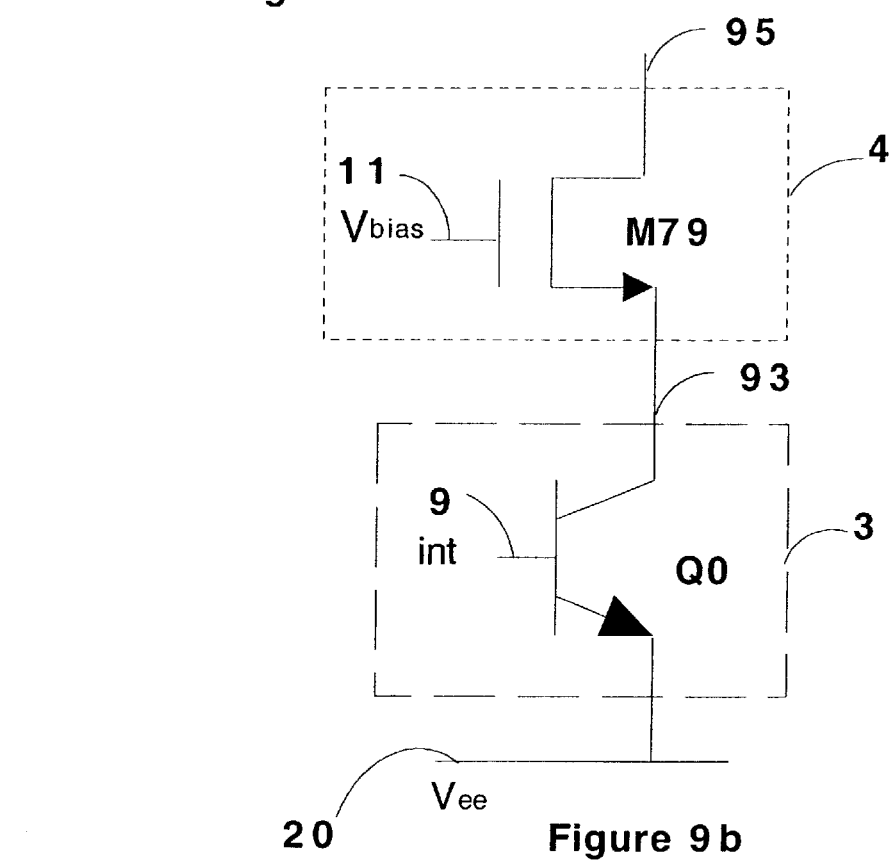
FIG. 9b is a schematic diagram illustrating another embodiment of the present invention.

Turning to FIGS. 9a and 9b another embodiment of the present invention is depicted. This configuration results in a four terminal composite switching device able to simultaneously provide both high $f_t$, and high voltage operation. This device is comprised of at least two stages. The first stage 3 comprises at least one semiconductor device preferably fabricated from a high $f_t$, low breakdown voltage technology. The second stage 4 comprises of at least one semiconductor device preferably fabricated from a breakdown voltage technology which is higher than the breakdown voltage technology used in the first stage 3.

FIG. 9a is a generic representation of a four terminal composite switching device. The square boxes T1 and T4 are generic representations of semiconductor devices which may be of any type. Transistor T1 is preferably fabricated in a high $f_t$, low breakdown voltage technology. InP single HBTs with InGaAs collectors and breakdown voltages of roughly 3 Volts are particularly adequate. Transistor T4 is preferably a FET fabricated from a high breakdown voltage material such as GaN. The same technologies that are mentioned above for use in the first 3 and second 4 stages of the current switches may also be used in the first 3 and second 4 stages of the four terminal composite switching devices.

FIG. 9b provides a more detailed representation of a four terminal composite switching device, where Q0 is an InP single HBT with an InGaAs collector and M79 is a GaN FET. The operation of the four terminal composite switching device is herein described in relation to FIG. 9b as an example. In general the voltage at node 93 is limited to the difference between $V_{bias}$ and the threshold voltage of M79. Thus, the source voltage $V_{ee}$ of Q0 is preferably chosen such that the voltage across Q0 is within a safe operating range for that transistor. For example, by choosing the threshold voltage for M79 to be −3 Volts and supplying −3 Volts at terminal node 11, the voltage at node 93 is limited to a small voltage, approximately 0 volts. However, a higher voltage than the breakdown voltage of the first stage 3 can be applied to the output 95 of the second stage 4, such that the four terminal composite switching device is able to provide both high $f_t$ and high voltage operation simultaneously.

One skilled in the art will appreciate that any number of composite devices may be integrated to form larger circuits enabling a variety of applications. In addition, any number of devices, for example resistors, may be inserted in between the first 3 and second stage 4 of the four terminal composite switching device without changing the ability of the four terminal composite switching device to provide for both high $f_t$ and high voltage operation simultaneously. The four terminal composite switching device may be incorporated into a high bias voltage cascade amplifier.

Having described the invention in connection with certain preferred embodiments thereof, modification will now certainly suggest itself to those skilled in the art. As such, the invention is not to be limited to the disclosed embodiments except as is specifically required by the appended claims.

What is claimed is:

1. A device comprising:

a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz; and a second stage comprising at least one second stage semiconductor device, said at least one second stage semiconductor device having a second stage semiconductor breakdown voltage greater than the first stage semiconductor device breakdown voltage, and said second stage being electrically coupled to said first stage.

2. The device of claim 1, wherein the at least one first stage semiconductor device comprises a Heterojunction Bipolar Transistor.

3. The device of claim 2, wherein the Heterojunction Bipolar Transistor has an InP substrate and a InGaAs collector.

4. The device of claim 1, wherein the at least one second stage semiconductor device comprises at least one Field-Effect Transistor.

5. The device of claim 4, wherein said at least one Field-Effect Transistor is a GaN Field-Effect Transistor.

6. The device of claim 1 further comprising a current source electrically coupled to said first stage.

7. A method of providing a device comprising the steps of:

providing a first stage having a first stage breakdown voltage less than or equal to 5 volts and said first stage having a unity current gain frequency greater than or equal to 100 GHz; and providing a second stage electrically connected to said first stage, said second stage having a second stage breakdown voltage greater than said first stage breakdown voltage.

8. The method as claimed in claim 7 wherein the step of providing a first stage comprises the step of providing at least one single Heterojunction Bipolar Transistor, having a InP substrate and a InGaAs collector.

9. The method as claimed in claim 7 wherein the step of providing a second stage comprises the step of providing at least one GaN Field-Effect Transistor.

10. A switch comprising:
a current source;
a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz, and said first stage being electrically coupled to said current source; and
a second stage comprising at least one second stage semiconductor device, said at least one second stage semiconductor device having a second stage semiconductor breakdown voltage greater than the first stage semiconductor device breakdown voltage, and said second stage being electrically coupled to said first stage such that said first stage is in between said current source and said second stage.

11. The switch of claim 10, wherein the at least one first stage semiconductor device comprises a Heterojunction Bipolar Transistor.

12. The switch of claim 11, wherein the Heterojunction Bipolar Transistor has an InP substrate and a InGaAs collector.

13. The switch of claim 10, wherein the at least one first stage semiconductor device is selected from the group consisting of InP Single Heterojunction Bipolar Transistors, InP Double Heterojunction Bipolar Transistors, said InP Double Heterojunction Bipolar Transistors having a collector thickness less than 4000 angstroms, InP High Electron Mobility Transistors, InP Field-Effect Transistors, GaAs Metal-Semiconductor Field-Effect Transistors, SiGe Heterojunction Bipolar Transistors having a collector thickness less than 4000 angstroms, and Si Metal Oxide Semiconductor Field-Effect Transistors having an unity current gain frequency greater than or equal to 100 GHz and a breakdown voltage less than or equal to 3 volts.

14. The switch of claim 10, wherein the at least one second stage semiconductor device comprises a Field-Effect Transistor.

15. The switch of claim 14, wherein the Field-Effect Transistor is a GaN Field-Effect Transistor.

16. The switch of claim 10, wherein the at least one second stage semiconductor device is selected from the group consisting of GaN Field-Effect Transistors, GaN Heterojunction Bipolar Transistors, InP Double Heterojunction Bipolar Transistors, said InP Double Heterojunction Bipolar Transistors having a collector thickness greater than 4000 angstroms, Si Carbide based transistors, and GaAs Heterojunction Bipolar Transistors.

17. A digital to analog converter comprising:
a plurality of switches, each switch comprising:
a current source;
a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz, and said first stage being electrically coupled to said current source;
a second stage comprising at least one second stage semiconductor device, said at least one second stage semiconductor device having a second stage semiconductor breakdown voltage greater than the first stage semiconductor device breakdown voltage, and said second stage being electrically coupled to said first stage such that said first stage is in between said current source and said second stage; and
at least one R-2R resistive ladder network, electrically coupled to said plurality of switches, to generate an analog voltage signal responsive to a digital input signal.

18. A current switch comprising:
a current source having an input and an output;
a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz, said at least one first stage semiconductor device having a first terminal, a second terminal and a third terminal, and said third terminal of said at least one first stage semiconductor device being electrically coupled to said input of said current source; and
a second stage comprising at least one second stage semiconductor device, said at least one second stage semiconductor device having a second stage semiconductor device breakdown voltage greater than the first stage semiconductor device breakdown voltage, said at least one second stage semiconductor device having a first terminal, a second terminal and a third terminal, said third terminal of said at least one second stage semiconductor device being electrically coupled to said first terminal of said at least one first stage semiconductor device.

19. The current switch of claim 18 further comprising:
a second first stage semiconductor device, said second first stage semiconductor device having a first stage semiconductor device breakdown voltage less than or equal to 5 volts, said second first stage semiconductor device having a unity current gain frequency greater than or equal to 100 GHz, said second first stage semiconductor device having a first terminal, a second terminal, and a third terminal, said third terminal of said at least one first stage semiconductor devices being electrically coupled to said third terminal of said second first stage semiconductor; and
a second second stage semiconductor device, said second second stage semiconductor device having a second second stage semiconductor device breakdown voltage greater than the first stage semiconductor device breakdown voltage, said second second stage semiconductor device having a first terminal, a second terminal and a third terminal, said third terminal of said second second stage semiconductor device being electrically coupled to said first terminal of said second first stage semiconductor device, and said second terminal of said second second stage semiconductor device being electrically coupled to said second terminal of said at least one second stage semiconductor device.

20. The current switch of claim 18, wherein the at least one first stage semiconductor device is a Heterojunction Bipolar Transistor, and wherein the first terminal is a collector of the Heterojunction Bipolar Transistor, the second terminal is a base of the Heterojunction Bipolar Transistor, and the third terminal is an emitter of the Heterojunction Bipolar Transistor.

21. The current switch of claim 20, wherein the Heterojunction Bipolar Transistor has an InP substrate and a InGaAs collector.

22. The current switch of claim 18, wherein the at least one second stage semiconductor device is a Field-Effect Transistor, and wherein the first terminal is a drain the Field-Effect Transistor, the second terminal is a gate of the Field-Effect Transistor, and the third terminal a source of the Field-Effect Transistors.

23. The current switch of claim 22, wherein the Field-Effect Transistor is a GaN Field-Effect Transistor.

24. A digital to analog converter comprising:
a plurality of switches comprising:
   a current source having an input and an output;
   a first stage comprising at least two first stage semiconductor devices, each of said at least two first stage semiconductor devices having a first stage semiconductor device breakdown voltage less than or equal to 5 volts, said at least two first stage semiconductor devices having a unity current gain frequency greater than or equal to 100 GHz, each of said at least two first stage semiconductor devices having a first terminal, a second terminal and a third terminal, said third terminal of one of said at least two first stage semiconductor devices being electrically coupled to said third terminal of another of said at least two first stage semiconductor devices, and said third terminals of said at least two first stage semiconductor devices being electrically coupled to said input of said current source; and
   a second stage comprising at least two second stage semiconductor devices, each of said at least two second stage semiconductor devices having a second stage semiconductor device breakdown voltage greater than the first stage semiconductor device breakdown voltage, each of said at least two second stage semiconductor devices having a first terminal, a second terminal and a third terminal, said second terminal of one of said at least two second stage semiconductor devices being electrically coupled to said second terminal of another of said at least two second stage semiconductor devices, said third terminal of one of said at least two second stage semiconductor devices being electrically coupled to said first terminal of one of said first stage semiconductor devices and said third terminal of another of said at least two second stage semiconductor devices being electrically coupled to said first terminal of another of said first stage semiconductor devices; and
two R-2R resistive ladder networks to generate an analog voltage signal responsive to a digital input signal, one of said two R-2R resistive ladder networks electrically coupled to each of said first terminals of one of said second stage semiconductor devices of said plurality of switches, another of said two R-2R resistive ladder networks electrically coupled to each of said first terminals of another of said second stage semiconductor devices of said plurality of switches.

25. A method of providing a current switch comprising the steps of:
generating a predetermined constant current;
providing a first stage device for receiving said constant current, said first stage having a first stage device breakdown voltage less than or equal to 5 volts and said first stage device having a unity current gain frequency greater than or equal to 100 GHz; and
providing a second stage device having a second stage device breakdown voltage greater than said first stage device breakdown voltage, said second stage device being electrically coupled to said first stage device.

26. The method of claim 25 wherein the step of providing a first stage device comprises the steps of:
providing two InP single Heterojunction Bipolar Transistors, each of said InP Heterojunction Bipolar Transistors having a collector, a base and an emitter; and
electrically coupling the emitter of one of said two InP single Heterojunction Bipolar Transistors to the emitter of another of said two InP single Heterojunction Bipolar Transistors.

27. The method of claim 25 wherein the step of providing a second stage device comprises the steps of:
providing two GaN Field-Effect Transistors, each of said GaN Field-Effect Transistors having a source, a gate and a drain; and
electrically coupling the gate of one of said two GaN Field-Effect Transistors to the gate of another of said two GaN Field-Effect Transistors.

28. The method of providing digital to analog conversion comprising the steps of:
providing a plurality of switches, said step of providing said plurality of switches comprising the steps of:
   generating a predetermined constant current;
   providing a first stage device for receiving said constant current, said first stage device having a first stage device breakdown voltage less than or equal to 5 volts and said first stage device having a unity current gain frequency greater than or equal to 100 GHz; and
   providing a second stage device having a second stage device breakdown voltage greater than said first stage device breakdown voltage, said second stage device being electrically coupled to said first stage device; and
electrically coupling two R-2R resistive ladder networks to said plurality of switches to generate an analog voltage signal responsive to a digital input signal.

29. A digital to analog converter comprising:
a plurality of current switches; and
a plurality of resistors electrically coupled to said plurality of current switches,
wherein each of said plurality of current switches comprises:
   (i) a current source;
   (ii) a first stage comprising at least one first stage semiconductor device, said at least one first stage semiconductor device having a first stage semiconductor device breakdown voltage less than or equal to 5 volts, said at least one first stage semiconductor device having a unity current gain frequency greater than or equal to 100 GHz, and said first stage being electrically coupled to said current source; and
   (iii) a second stage comprising at least one second stage semiconductor device, said at least one second stage semiconductor device having a second stage semiconductor breakdown voltage greater than the first stage semiconductor device breakdown voltage, and said second stage being electrically coupled to said first stage such that said first stage is in between said current source and said second stage.

30. The digital to analog converter of claim 29 wherein said plurality of resistors are arranged as an R-2R ladder network.

* * * * *